US009784805B2

(12) United States Patent
Saes et al.

(10) Patent No.: US 9,784,805 B2
(45) Date of Patent: Oct. 10, 2017

(54) MRI RADIO FREQUENCY RECEIVER COMPRISING DIGITAL DOWN CONVERTER WITH CONNECTOR THAT PASSES ANALOG SIGNAL BEING CONTAINED WITHIN RADIO FREQUENCY RECEIVER COIL UNIT

(75) Inventors: Marc Paul Saes, Eindhoven (NL); Johan Samuel Van Den Brink, Eindhoven (NL); Filips Van Liere, Eindhoven (NL); Roel Penterman, Eindhoven (NL); Ralph Kurt, Eindhoven (NL); Emiel Peeters, Eindhoven (NL); Dirk Jan Broer, Eindhoven (NL); Michel Paul Barbara Van Bruggen, Eindhoven (NL); Hans Van Zon, Eindhoven (NL); Miha Fuderer, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 303 days.

(21) Appl. No.: 12/665,336

(22) PCT Filed: Jun. 16, 2008

(86) PCT No.: PCT/IB2008/052355
§ 371 (c)(1),
(2), (4) Date: Jun. 23, 2010

(87) PCT Pub. No.: WO2008/155703
PCT Pub. Date: Dec. 24, 2008

(65) Prior Publication Data
US 2010/0259261 A1 Oct. 14, 2010

(30) Foreign Application Priority Data

Jun. 19, 2007 (EP) ..................................... 07110508

(51) Int. Cl.
G01R 33/341 (2006.01)
G01R 33/3415 (2006.01)
G01R 33/36 (2006.01)

(52) U.S. Cl.
CPC ........ *G01R 33/341* (2013.01); *G01R 33/3415* (2013.01); *G01R 33/3621* (2013.01); *G01R 33/3692* (2013.01)

(58) Field of Classification Search
USPC ......................... 324/300–322; 600/407–435; 382/128–131; 333/219–235
See application file for complete search history.

(56) References Cited

U.S. PATENT DOCUMENTS 5,384,536 A   1/1995 Murakami et al.
5,529,068 A *  6/1996 Hoenninger, III . G01R 33/3621
                                                                    324/309

(Continued)

FOREIGN PATENT DOCUMENTS

WO    03025607 A1   3/2003
WO    03032002 A1   4/2003

(Continued)

OTHER PUBLICATIONS

Wei, J., et al.; A realization of digital wireless transmission for MRI signals based on 802.11b; 2007; J. of Magnetic Resonance; 186:358-363.

*Primary Examiner* — Melissa Koval
*Assistant Examiner* — Tiffany Fetzner

(57) ABSTRACT

The invention relates to a nuclear magnetic resonance imaging radio frequency-receiver (112; 216; 308; 404), the receiver (112; 216; 308; 404) being adapted to receive analog signals from at least one radio frequency receiver coil unit (106; 200; 202; 300; 400; 402), the radio frequency receiver (112; 216; 308; 404) comprising: an analog-digital converter (118; 226) to convert the analog pre-amplified (Continued)

magnetic resonance signal into a digital signal, means (120; 230) for digital down converting the digital signal and a first communication interface (130; 252) adapted for transmitting the down converted digital signal via a communication link (e.g. wireless, optical or wire-bound).

18 Claims, 4 Drawing Sheets

(56) References Cited

U.S. PATENT DOCUMENTS

| | | | |
|---|---|---|---|
| 6,025,717 A * | 2/2000 | Hertz et al. | 324/310 |
| 6,339,717 B1 | 1/2002 | Baumgartl et al. | |
| 6,356,780 B1 | 3/2002 | Licato et al. | |
| 6,490,472 B1 * | 12/2002 | Li et al. | 600/410 |
| 6,492,815 B2 * | 12/2002 | Hinks et al. | 324/318 |
| 6,529,000 B2 * | 3/2003 | Lou | 324/309 |
| 6,549,009 B1 * | 4/2003 | Hertz et al. | 324/309 |
| 7,123,009 B1 * | 10/2006 | Scott | 324/311 |
| 7,173,426 B1 * | 2/2007 | Bulumulla et al. | 324/318 |
| 7,372,272 B2 * | 5/2008 | Habara | G01R 33/3607 |
| | | | 324/318 |
| 7,403,011 B2 * | 7/2008 | Burdick et al. | 324/318 |
| 7,701,220 B2 * | 4/2010 | Ehnholm | 324/318 |
| 7,940,046 B2 * | 5/2011 | Baumgartl et al. | 324/322 |
| 8,575,935 B2 * | 11/2013 | Roeven | 324/322 |
| 8,947,091 B2 * | 2/2015 | Nakanishi | G01R 33/3692 |
| | | | 324/307 |
| 9,075,114 B2 * | 7/2015 | Schmidt | G01R 33/34046 |
| 2002/0087063 A1 * | 7/2002 | Lou | 600/410 |
| 2002/0113591 A1 * | 8/2002 | Hinks et al. | 324/313 |
| 2004/0015079 A1 | 1/2004 | Berger | |
| 2005/0249667 A1 * | 11/2005 | Tuszynski et al. | 424/9.3 |
| 2006/0049825 A1 * | 3/2006 | Habara | G01R 33/3621 |
| | | | 324/207.2 |
| 2007/0188175 A1 * | 8/2007 | Burdick et al. | 324/322 |
| 2007/0258479 A1 * | 11/2007 | Baumgartl et al. | 370/463 |
| 2009/0230966 A1 * | 9/2009 | Ehnholm | 324/322 |
| 2010/0259261 A1 * | 10/2010 | Saes et al. | 324/309 |
| 2010/0260293 A1 * | 10/2010 | Roeven | 375/340 |
| 2011/0101977 A1 * | 5/2011 | Nakanishi | G01R 33/3692 |
| | | | 324/307 |
| 2011/0124301 A1 * | 5/2011 | Prasidh et al. | 455/110 |
| 2012/0139538 A1 * | 6/2012 | Schmidt | G01R 33/34046 |
| | | | 324/309 |

FOREIGN PATENT DOCUMENTS

| | | |
|---|---|---|
| WO | 2004089211 A2 | 10/2004 |
| WO | 2005024448 A1 | 3/2005 |
| WO | 2006030331 A2 | 3/2006 |
| WO | 2006048816 A1 | 5/2006 |
| WO | 2006103591 A1 | 10/2006 |
| WO | 2007043009 A2 | 4/2007 |
| WO | 2008075268 A1 | 6/2008 |

* cited by examiner

MRI RADIO FREQUENCY RECEIVER COMPRISING DIGITAL DOWN CONVERTER WITH CONNECTOR THAT PASSES ANALOG SIGNAL BEING CONTAINED WITHIN RADIO FREQUENCY RECEIVER COIL UNIT

TECHNICAL FIELD

The invention relates to a nuclear magnetic resonance imaging radio frequency receiver, a magnetic resonance imaging apparatus, an RF interface structure, a control and data acquisition system, a method for receiving a radio frequency signal from a magnetic resonance imaging receiver coil unit and a method for upgrading a legacy magnetic resonance imaging system.

BACKGROUND AND RELATED ART

Magnetic resonance imaging (MRI) is a well known and established technique for imaging of soft tissue structures near and around bones and it is the most sensitive examination technique for spinal and joint problems. MRI is widely used to diagnose sports related injuries, especially those affecting the knee, shoulder, hip, elbow and wrist. In addition, MRI of the heart, aorta, coronary arteries and blood vessels is a fast, non-invasive tool for diagnosing coronary artery disease and heart problems. Organs of the chest and abdomen, including the lungs, liver, kidney, spleen, pancreas and abdominal vessels can also be examined in high detail with MRI, enabling the diagnosis and evaluation of tumors and functional disorders.

In MRI, radio frequency waves are directed at nuclei for example protons in a strong external magnetic field. The protons are first excited and then relaxed, emitting radio signals that can be detected and computer processed to form an image. Thereby, Magnetic Resonance (MR) radio frequency (RF) receive coils are necessary parts to receive said RF signals transmitted in a particular MR experiment. Thereby, the best antenna element location is close to the human body being scanned and therefore most of the MR receive coils are positioned on the patient by a scanner operator.

The actual workflow effectiveness of a particular coil implementation is very important to the MR scanner's operation since it determines in a large part the patient throughput of the MR scanner. Furthermore, a patient benefits from receive coils that have improved patient comfort which is mainly determined by efficient workflow (potentially a shorter or lesser claustrophobic experience) and an ergonomic design that reduces cable clutter, that adapts more flexible to different body shapes and is more lightweight.

Since MR receive coils or in general MR receive chains comprising the coils and various electronic components like amplifiers, switches etc., are highly sensitive to disturbances by external radio frequency waves, said MR receive chains have to be electromagnetically shielded which requires a spatial separation of the MR receive chains in an exam room and the control system in a separate technical room.

Current state of the art for MR receive chains feature a massive parallel analogue solution with many expensive analogue design elements such as RF switches, RF amplifiers, RF power supplies, RF cables and RF connectors etc. All these components are typically strewn over a distance of 10-20 meters between the receive chain in the exam room and analogue to digital converters in the technical room, which makes it one of the most complex and challenging aspects to cost effectively design and produce an MR scanner due to component spread and unwanted interactions between the many galvanic parts.

These problems become even more severe in the case of higher element counts in coils, i.e., coil systems comprising multiple individual coils which need to be effectively combined using a state of the art wire technology. Also, in MRI systems each galvanic wire needs trapping considerations and careful design must avoid image quality detrimental effects due to galvanic wiring coupling effects.

These problems can be overcome using a digital interface for a receiver coil unit. In this case, analogue to digital conversion is performed already within the receiver coil unit including the receive coil and the receiver. Connector and cable size and handling issues even for high element counts in coils can be overcome by effectively combining multiple elements information to just a few optical fibers or galvanic wires. Transferring RF and control and status signals digitally with optical fibers versus traditional galvanic wiring significantly reduces galvanic wiring overhead. This even enables a wireless transmission of said elements information. Comparing a digital interface for a coil to available technologies and components, the digital data transport and combined solution scores high on cost, size and power efficiency. An added benefit of a digital solution is that it allows additional control and acquisition features to be added in the coil with negligible cost, enabling for example tune transmit coils for self testing coils and control intensive solutions for more efficient coil power supplies etc.

WO 03/032002 A1 suggests a wireless remote control unit that operates in the radio frequency bandwidth which can be used for interfacing with a sequence control system and an image processing system from within a magnetic resonance suite in the presence of a magnetic field produced by a main magnet assembly.

U.S. Pat. No. 6,356,780 B1 discloses a technique for managing data relating to peripheral devices and subsystems in an imaging system including providing memory circuitry and, where desired, signal processing circuitry resident in the peripheral devices.

WO 2006/103591 A1 relates to a magnetic resonance imaging system, to a magnetic resonance imaging method for operating a magnetic resonance imaging system and a computer program for operating a magnetic resonance imaging system. In order to considerably reduce the number of cabling in a magnetic resonance imaging system, a magnetic resonance imaging system is suggested in which the number of cables are reduced by transferring the magnetic resonance signal data from the examination zone or from the vicinity of the examination zone to a remote signal processing unit outside the examination zone using a digital format. This allows the use of a simple digital connection, e.g., a single connection wire or like. A large bundle of coaxial cables is not needed, thus leading to a cheaper and more reliable magnetic resonance imaging system.

WO 2004/089211 A2 discloses a magnetic resonance imaging examination apparatus including a receiver assembly located in the vicinity of an examination zone for producing a signal in response to magnetic resonance signals for transmission to a signal processing system. To overcome problems associated with metallic cable connections between the signal generator and a signal processing unit and to overcome problems associated with existing non-metallic connections, the receiver assembly comprises a digitizer for generating a digital electromagnetic signal for transmission to the signal processing unit.

U.S. Pat. No. 6,339,717 B1 discloses a medical examination system, particularly a magnetic resonance system, comprising a host computer unit, a control computer unit and an image computer unit. Thereby, analogue to digital (AD) converters are arranged close to the radio frequency coils of the image signal reception system, where the examination system is fashioned as a magnetic resonance system. Thereby, the AD converter can be arranged in a connecting plug with which the signal line is connected to the radio frequency coils.

WO 2006/030331 A2 discloses a radio frequency receive coil which includes an antenna that is tuned to a magnetic resonance frequency to detect a magnetic resonance signal. Electronics disposed on with the antenna as a unitary structure include compression circuitry that comprises the magnetic resonance signal and a gain controlled by a gain control signal to produce a compressed magnetic resonance signal. Further, the electronics comprise an analogue to digital converter that digitizes a compressed magnetic resonance signal to produce a digitized compressed magnetic resonance signal.

SUMMARY OF THE INVENTION

The present invention provides a nuclear magnetic resonance imaging radio frequency receiver, the receiver being adapted to receive analogue signals from at least one radio frequency receive coil unit, the radio frequency receiver comprising an analogue-digital converter to convert the analogue pre-amplified magnetic resonance signal into a digital signal, means for digital down converting the digital signal and a first communication interface adapted for transmitting the down converted digital signal via a communication link.

Digital transmission of magnetic resonance signals or in general transferring RF and control and status signals digitally for example over an optical fiber has the advantage, that galvanic wiring overhead is significantly reduced. In addition, this allows for a packet switched digital network which allows for effectively controlling different receivers and to merge and combine different MR data chains to a single digital network interface per coil. This effectively converts the current analogue chain of state of the art MRI systems to an almost purely digital chain with a very much reduced analogue component content. The analogue chain effectively reduces to a length under 0.4 meters. The digital technology furthermore allows choosing an interface layer that can be optimized for its system engineering aspects: reduce cabling and connectors cost, complexity, size, reliability etc. The abstracting capabilities of a digitized receive chain also then allows for abstracting the receive chain on a software layer from the rest of the control and acquisition system or via a functional interface on top of a network standard such as TCP/IP ethernet. A fully abstracted RF-chain is also potentially an OEMable product.

Using the digital down converter (i.e., a demodulator), a variable data reduction can be performed by demodulation of the received radio frequency signal bands. For example, in the case of a 1.5 T proton MRI system, by performing a digital down conversion of the digital signal the digitized bandwidth can be reduced by almost a factor 50 since the acquired RF-frequency is around 64 MHz, whereas the suitable bandwidth is only ±1.5 MHz.

In accordance with an embodiment of the invention, the receiver further comprises a local clock oscillator. Thereby, the local clock oscillator is synchronizable by a pilot tone signal, the pilot tone signal being generated by a pilot tone transmit coil or, in accordance with another embodiment of the invention, the local clock oscillator is synchronizable by a system clock. By using the digital links as a method of distributing a central system clock it is possible to phase and frequency lock different receivers in the entire system. Since then all control and status information, MR data and synchronization data are traveling over a single connection, it is possible to create a long term stable digital coil interface that supports infinite channels up to the bandwidth limit of the digital link.

In the embodiment of synchronization by a pilot tone signal, an RF-frequency is continuously generated by the pilot tone transmit coil and acquired along with the MR signal. As the phase of the pilot tone is known, the time at which the MR signal was acquired can be deduced.

In the embodiment of a synchronization by a master system clock, for such a master system clock a long term frequency stability is required. However, due to the distribution of the master system clock to various coil elements, the shorter stability or jitter of the clock deteriorates as it is propagated through various electronic and optical components. Such kind of deterioration of the clock is however unacceptable for integrated RF devices, in particular for the analogue-digital converter of the digital receiver. The local oscillator is therefore chosen as a voltage controlled crystal oscillator (VCXO) to provide a low jitter required by such components. However, a network node having no specific clock quality requirements does not need to provide a low jitter clock.

For example a system clock is distributed by utilizing the system clock as a basis for generating the fiber bit clock. This enables each upstream (towards the coils) fiber connection to carry the system clock. At each fiber upstream destination like a receiver, the fiber data is sampled by using a recovered clock derived from the data itself. This recovered data clock still contains too much high frequency jitter to use as an actual clock as already mentioned above. Therefore, the local load jitter voltage controlled oscillator is used. Long term stability (i.e., low frequency jitter) is guaranteed by using the recovered clock since it is long term coupled to the system clock.

In accordance with an embodiment of the invention, the receiver further comprises means for encoding and/or compressing the down converted digital signal. Encoding and/or compressing the down converted digital signal enables to further reduce the amount of data communicated via the communication link. As already mentioned above, the receiver demodulation stage allows to reduce the data from the analogue-digital converter running at a digital conversion up to a factor of 50. This reduction is very important since data transport bandwidth is a large contributor to dissipation in the coil. In addition, the data encoding and/or compression that makes use of the MR signal properties can further reduce the bandwidth and therewith the dissipation.

In accordance with an embodiment of the invention, the receiver is comprised in the radio frequency receiver coil unit as a unitary structure. Therewith, the remaining analogue chain components and complexity vastly reduce the spread of the RF-chain which is in this case fully contained in the coil unit itself which improves diagnostic and meantime to repair. in addition, integration of the receiver in the coil unit enables for a robust wireless coil solution that has reduced MR signal data bandwidth before transmission to a control system which significantly reduces power dissipation of a wireless coil.

Comprising the receiver in the radio frequency receiver coil unit further enables a new business opportunity, namely an industry wide harmonization of RF coil assembly interfacing. This harmonization would be of benefit to the customer and the manufacturers since it would decrease the cost of ownership of the entire RF receive chain in MR systems since it is a heavy platform resource and cost load at each MR organization.

Specifically, a digital interface over an analogue interface enables this due to the many improvements. For example the digital transport allows element count growth without connector impact by merging data of different elements already in the coil assembly. Further, merging of digital data in the coil assembly allows for a single galvanic or optical wire to handle all the data instead of parallel solutions as is current state of the art. An analogue solution would also use a higher power dissipation for merging as well as having a difficult to handle analogue complexity. Further, encoding and/or loss less compression digitally in the coil assembly allows reducing the data to be sent over the fiber and lowers the transport power dissipation, since encoding processing power is much less than sending the unencoded data. Also, analogue compression is more difficult to manage as a stable solution and allows less compression due to complexity of design, power dissipation etc. A digital interface further allows more intelligent handling of coil assembly and element IDs and properties. Also coil assembly based digital control allows for more comprehensive coil assembly self diagnostics. Even, a variability of an MR receive chain with respect to nuclei frequencies is completely enclosed within the coil assembly and not with the system anymore.

Only with digital packets data transmission wireless coils are enabled since analogue transmission would fail on bandwidth, power dissipation and reliable connections. Due to bandwidth limitations of current wireless solutions, digital wired coils will be for the near future combined with wireless coils when appropriate. Thereby, wireless coils can also benefit from the improved definability and manageability of the system coil interface.

In accordance with an embodiment of the invention, the receiver further comprises merging means, wherein the merging means are adapted to combine multiple digitized magnetic resonance signals and control and status signals for controlling the receiver, the multiple digitized magnetic resonance signals originating from multiple antenna elements of the receiver coil unit. By designing the merging means in a way, that a fiber interface from other receiver building blocks and a fiber interface towards coil connectors and the main system is provided, multiple receiver units and coils can be combined by for example daisy chaining. Such daisy chaining can be performed up to a limit determined by the bandwidth of the used communication links and an almost arbitrary number of receivers and coils can be connected to a single output fiber link. Potential daisy chaining of coils themselves may additionally reduce the length of internal wiring or even allows of getting rid of wires completely in some cases. In this case, a tree topology is obtained.

In accordance with an embodiment of the invention, the receiver further comprises an electronic testing circuit, wherein the electronic test circuit is adapted for examining the electronic components of the radio frequency receiver, wherein the examination is being performable using a test coil, said test coil being adapted in the radio frequency receiver coil unit. Since digital electronics can easily be cost effectively expanded with intelligent functional additions, such coil self testing and self diagnostics are enabled that reduce service and manufacturing costs significantly.

In accordance with an embodiment of the invention, the receiver further comprises means for spike detection and removal in the digitized radio frequency signal. Such an implementation of spiked detection and removal means in the receiver allows for a more robust and cost effective solution for spike detection which can serve as a basis for a system level spike suppression.

In accordance with an embodiment of the invention, the first communication interface is adapted for providing a digitized signal via the communication link by wireless radio frequency transmission or optical transmission or wired transmission. However, an optical or wireless transmission is preferred. A wireless radio frequency transmission is possible, even though the RF receiver unit is highly sensitive to electromagnetic disturbances. The reason is, that the RF receiver unit operates in the lower MHz range, whereas wireless transmission is performed in the GHz range.

In another aspect the invention relates to a magnetic resonance imaging apparatus, comprising a nuclear magnetic resonance imaging radio frequency receiver, at least one radio frequency receiver coil unit, a main magnet adapted for generating a main magnetic field, magnetic field gradient coils adapted for selectively generating magnetic field gradients to be superimposed to the main magnetic field, a radio frequency transmit coil for generating a radio frequency pulse sequence, a second communication interface, said second communication interface being adapted for communication with the first communication interface and a control and data acquisition system, wherein the control and data acquisition system is adapted for communicating with the receiver using the second communication interface.

In accordance with an embodiment of the invention, the apparatus further comprises a system clock, the system clock being adapted for synchronization of the local clock of the receiver.

In another aspect the invention relates to an RF interface structure comprising at least one digital receiver, a second communication interface, said second communication interface being adapted for communication with a first communication interface being adapted for communication with the first communication interface of the receiver, merging means, wherein the merging means are adapted to combine multiple signals being communicated over multiple second communication interfaces, said multiple signals being communicated to or from multiple radio frequency receiver coil units using multiple receivers, and a radio frequency scan control unit, said radio frequency scan control unit being adapted for controlling the at least one receiver.

The advantage of such an RF interface structure is, that it can be provided by an OEM supplier to magnetic resonance OEMs which integrate the RF interface structure into their existing systems. A digital subsystem has less component spread and an improved manufacturing reproduce ability. Also, a long term standardization of the digital interface is possible. Hence, the RF interface structure of then invention achieves that uniform upgrade of installed bases magnetic resonance imaging apparatus.

In accordance with an embodiment of the invention, the RF interface structure further comprises a system clock, the system clock being adapted for synchronization of the local clock of the receiver. However, in general, the system clock can be located anywhere in the magnetic resonance imaging system.

In accordance with an embodiment of the invention, the RF interface structure is controllable by a control and data acquisition system, wherein the control and data acquisition system is adapted to generate and communicate pulse sequences and/or control commands to the RF interface structure.

In accordance with an embodiment of the invention, the RF interface structure further comprises means for generation of pulse sequences and/or control commands, said pulse sequences and/or control commands being communicated to the receiver with the means of the second interface. However, said means for generation of pulse sequences and/or control commands can also be comprised in the control and data acquisition system or in a separate unit.

In another aspect, the invention relates to a control and data acquisition system comprising means for generation of pulse sequences and/or control commands, said pulse sequences and/or control commands being adapted to control an RF interface structure, said RF interface structure comprising a digital receiver.

In accordance with an embodiment of the invention, the RF interface structure further comprises a second communication interface, said second communication interface being adapted for communication with the first communication interface, merging means, wherein the merging means are adapted to combine multiple signals being communicated over multiple second communication interfaces, said multiple signals being communicated to or from multiple radio frequency receiver coil units using multiple receivers and the radio frequency scan control unit, said radio frequency scan control unit being adapted for controlling the receivers.

In accordance with an embodiment of the invention, the control and data acquisition system further comprises a system clock, the system clock being adapted for synchronization of the local clock of the receiver.

In another aspect, the invention relates to a method for receiving the radio frequency signal from a magnetic resonance imaging receiver coil unit, the method comprising receiving an analogue pre-amplified magnetic resonance signal from the receiver coil unit, converting the analogue signal into a digital signal, digital down converting the digital signal and communicating the digital down converted signal over a first communication interface.

In accordance with an embodiment of the invention, the method further comprises synchronization of a local clock oscillator.

In accordance with an embodiment of the invention, the local clock oscillator is synchronized by a pilot tone signal, the pilot tone signal being generated by a pilot tone transmit coil or wherein the local clock oscillator is synchronized by a system clock.

In accordance with an embodiment of the invention, the method further comprises encoding and/or compressing the down converted digital signal.

In accordance with an embodiment of the invention, the method further comprises combining multiple digitized magnetic resonance signals and control and status signals for controlling the receiver, wherein the multiple digitized magnetic resonance signals are originating from multiple antenna elements of the receiver coil unit.

In accordance with an embodiment of the invention, the method further comprises examining the electronic components of the radio frequency receiver, wherein the examination is being performed using a test coil, said test coil being adapted in the radio frequency receiver coil unit.

In accordance with an embodiment of the invention, the method further comprises spike detection and removal in the digitized radio frequency signal.

In another aspect, the invention relates to a method for upgrading a legacy magnetic resonance imaging system having at least one receiver coil unit, the method comprising providing a digital receiver.

Providing digital magnetic resonance receive chains to market with a digital RF coil assembly interfacing will create a large leverage on the platform and allows to set a standard in the market that addresses the customer on his cost and ownership of coil assemblies. Even the capability of a single coil assembly type for more than one manufacturer could thereby be achieved. It is thereby possible, that business is performed on all digital RF-chain components, whereby the OEM integrates these components in their system. It is also possible, that complete coil assemblies are integrated in the OEM system. Another scenario for upgrading a legacy magnetic resonance imaging system can be business on the coil assembly based receiver component level, whereby the OEM creates only the system side of the digital network and protocols. Another possibility is business on the coil assembly based receiver system side stand alone receive chain, whereby the OEM interfaces this to the otherwise proprietary control and data acquisition system.

In accordance with an embodiment of the invention, the method further comprises providing a control and data acquisition system comprising means for generation of pulse sequences and/or control commands, said pulse sequences and/or control commands being adapted to control an RF interface structure, said RF interface structure comprising the receiver.

BRIEF DESCRIPTION OF THE DRAWINGS

In the following preferred embodiments of the invention are described in greater detail by way of example only making reference to the drawings in which.

DETAILED DESCRIPTION

Figure 1:
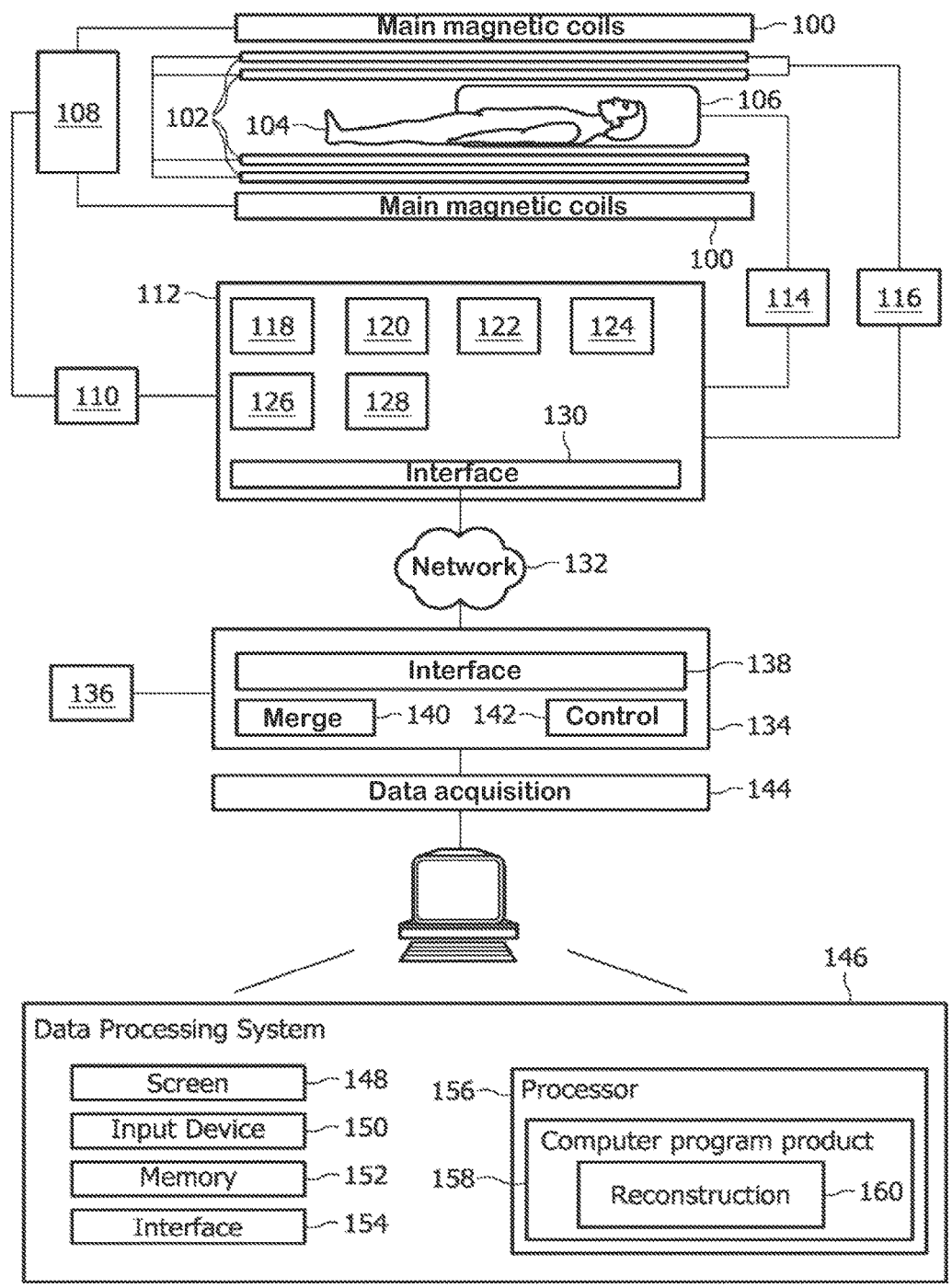
FIG. 1 is a block diagram of an embodiment of a magnetic resonance imaging apparatus.

FIG. 1 is a block diagram of an embodiment of a magnetic resonance imaging apparatus. The magnetic resonance imaging apparatus comprises main magnet coils 100 adapted to produce a static magnetic field required to perform magnetic resonance imaging. The apparatus further comprises gradient coils 102 which enable to selectively image different voxels (volume picture elements) of a subject. A patient 104 is located within the typically cylindrical bore of the main magnetic coils 100. Parts of the body of the patient 104 are imaged using a coil 106. Such a coil may comprise a transmit coil, which may include a pilot tone transmit coil for generating a pilot tone, and a receiver coil, or alternatively a transmit coil being separated from the pilot tone transmit coil and/or the receiver coil may be additionally provided. Alternatively, the pilot tone transmit coil may be a separate coil in a receiver coil unit, which physically would appear as a receive coil.

The main magnet coils 100 are controlled by a main coil power supply 108 and a power supply control 110. However, since superconducting magnets are the most common magnet type found in MRI scanners today, such a main coil power supply 108 and a power supply control 110 are only necessary for extremely rare shutdown and start-up procedures of said superconducting magnet.

The gradient coils 102 are controlled by a gradient coils control unit 116. Also provided is a transmit coil amplifier 114 which is connected to the coil 106. The coil 106 itself can be adapted as a coil comprising many element coils. The coil may even be adapted as multi-element phased array coils which are capable of acquiring multiple channels of data in parallel.

The power supply control 110, the transmit control amplifier unit 114 and the gradient coils control unit 116 are connected to a receiver 112. The receiver 112 comprises an Analogue-Digital-Converter 118 being adapted to convert RF signals received from the coil 106 into digital signals. Using a digital down converter 120, the digitized MR signals can be down converted in order to reduce the data rate from the Analogue-Digital-Converter to a factor 50 or less (from e.g., 50 MHz to 1 MHz). An encoder and/or compressor 122 may even further reduce the bandwidth and therewith power dissipation by making use of the MR signal properties.

The receiver 112 further comprises an element based merge unit 124. The element based merge unit 124 serves the purpose of merging MR data and status data incoming to the receiver with the acquired MR data and the local status and to provide said merged information for further processing to the system. This is especially necessary, when multiple coils are connected to the receiver 112 or when multiple receivers are daisy chained.

A spike detection unit 126 comprised in the receiver 112 has the purpose, to detect unwanted spikes due to for example electrostatic discharges in the system. The receiver 112 further comprises a local clock 128. The main requirement for this local clock 128 is that it is extremely short term stable.

The receiver 112 further comprises an interface 130. Thereby, the interface 130 is adapted for transmitting for example the down converted digital signal via a communication link over a network 132 to an RF-chain slave subsystem 134. Thereby, the RF-chain slave subsystem 134 also possesses an interface 138. Such kind of interface may be an over the air interface for wireless data transmission or an optical fiber.

The RF-chain slave subsystem 134 comprises an RF scan control unit 142 and a system based merge unit 140. The system based merge unit 140 serves the purpose of merging MR data and status information incoming to the interface 138 from multiple receivers. It also serves the purpose of broadcasting control and status commands to all incoming fibers, said fibers incoming to the interface 138.

The RF-chain slave subsystem 134 is connected to a master system clock 136. Each node of the network 132 has its own local clock and a set of event timers that control the timing of devices local to the node. Each local clock is thereby synchronized with the system master clock 136. The digital electronics of each node including the event timer is implemented as a synchronous circuit driven by the local clock. So called stretch engines provide devices which control parameters at points in time defined by the event timer.

Since each node typically has one or more devices such as RF transmitters and/or RF receivers for multi-channel MR signal generation and reception, device operation must be synchronized to a high degree to ensure coherent multi-channel operation. Ensuring, that all clocks on the network run at the same frequency is referred to as clock distribution.

The synchronization of event timers is referred to as time alignment. In the apparatus depicted in FIG. 1, no special dedicated signal lines need to be used for clock distribution or time alignment. This reduces the number of hardware components and increases the reliability of the system. It does however require specific protocols, calibration measurements and adjustment techniques. Thereby, clock distribution and time alignment can for example be realized through the following measures: distributing the clock, achieving frequency lock, starting timers, measuring time delay, adjusting timers, time delay compensation.

In the following, clock synchronization is depicted in a more detailed way:

For clock distribution, in FIG. 1 the master system clock 136 is taken as a reference. In fact, any node of the network can provide a clock reference. However, in practice, the root node provides the most convenient location of the network for the clock reference. For magnetic resonance imaging an extremely stable reference clock is required, typically implemented as an Oven Controlled Crystal Oscillator. This clock ensures long term frequency stability for all clocks in the network.

Frequency lock ensures that all local clocks in the network run at exactly the same rate. Once all local clocks are in frequency lock, any phase difference present between clocks will remain constant. A local oscillator functioning as local clock 128 is present on each network node like the receiver 112. The frequency of the local clock oscillator is locked to the link data rate through a phase locked loop (PLL). The short term stability or jitter of the clock deteriorates as it is propagated through various electronic and optical components. The local clock oscillator is therefore chosen as a voltage controlled crystal oscillator (VCXO) to provide a low jitter required by components of the receiver 112.

Event timers are started by means of a start message transmitted over the network. As network transport latency is variable, the start message only manages to synchronize event timers to within the maximum latency incurred by message transmission. The network 132 provides special messages referred to as signals for low latency transmission of dedicated control messages such as start signal. After starting event timers, time alignment is guaranteed within for example 10 μs facilitating the precise measurement of time delay and subsequent adjustment of timers and time delay compensation.

The network 132 provides no measures to determine the time delay but derives time delay indirectly by means of an RF signal. This requires at least one RF transmitter on each node that requires accurate time alignment. By transmitting a signal with a node frequency and phase, the time delay between transmitting and receiving nodes can be determined. Once time delay has been measured, simply inserting an appropriate time delay at each event timer synchronizes event timers.

However, even if time alignment would be exact, event timers inhibit synchronization of events to an accuracy typically only better than 100 ns. As local clocks operate at 50 MHz, this accuracy can be improved to 20 ns by stalling event timers by multiple clock ticks. Additional accuracy is achieved by compensating for time delays via special measures. This allows to increase the accuracy of time synchronization up to about 10 ps.

Time delay compensation techniques depend strongly on the specific device in question. In case of FIG. 1, the primary device to be considered is the receiver unit 112. Timing precision better than typically 20 ns provided by time alignment can be obtained by resampling the RF pulse modulation waveform on for example the 100 ns time grid of the stretch engine. For continuous modulation waveforms, the phase evolution of the modulation frequency can also be computed avoiding the need to provide sample phase values and providing only a single initial phase in appropriately sampled frequency values.

Referring back to the MR system assembly in FIG. 1, the RF-chain slave subsystem 134 is connected by means of the control and data acquisition system 144 to a data processing system 146. The data processing system 146 mainly serves the purpose of reconstruction of MR images from the acquired MR image data. This is performed using a module 160 which is adapted as a computer program product 158, which may comprise a non-transitory computer readable medium, storing a program executable by a processor 156. The data processing system 146 further comprises a screen 148 for example to display said reconstructed MR images and an input device 150, for example a keyboard or a mouse. The data processing system 146 further comprises a memory 152 and an interface 154, said interface 154 being adapted for communication with the master control and data acquisition system 144. The memory 152 may be adapted as any storage device known in the art like for example hard drives, DVD or CD drives, volatile and non-volatile kinds of memories etc.

Figure 2:
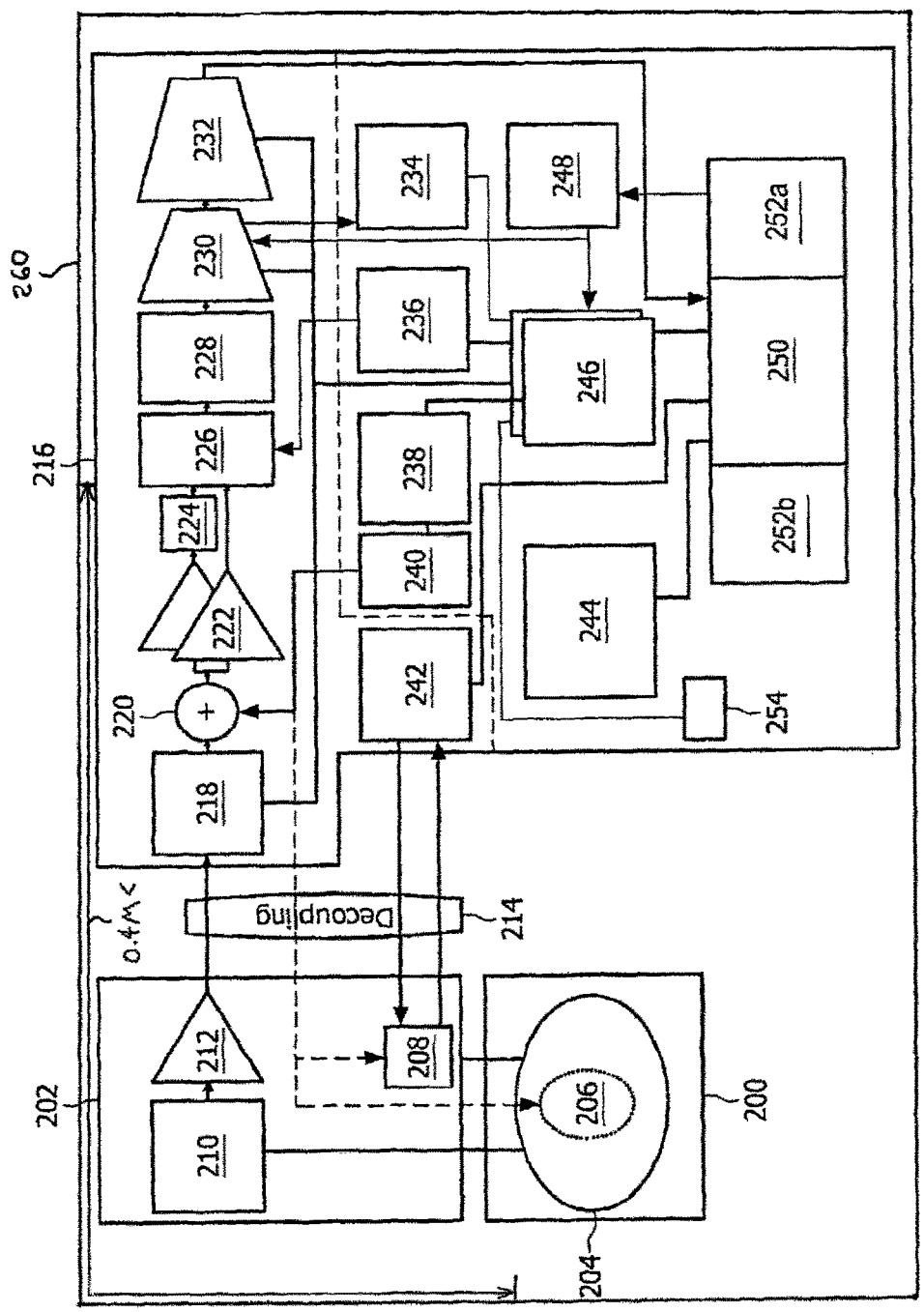
FIG. 2 is a block diagram of an embodiment of an RF receiver coil unit including a receiver unit according to the invention.

FIG. 2 shows a block diagram of an RF receiver coil unit including an embodiment of RF receiver 216 according to the invention. An antenna element 200 comprising an RF coil 204 and a test coil 206 is connected with means of a coil element conditioner 202 via decoupling means 214 to the RF receiver 216. Thereby, the test coil 206 is optional and not necessarily required for operation of the RF receiver 216. The coil element conditioner 202 comprises an element matching unit 210, an amplifier 212 and PIN diodes 208 in order to be able to tune or de-tune the RF coil 204 and respective electronic circuits. Such a tuning and de-tuning is necessary since excitation of the investigated spin system using a transmit coil would induce extremely high currents in the RF receive coil 204 if the RF receive coil 204 would be in the tuned state during said transmission.

The element matching unit 210 is coil design specific and serves the purpose of matching the antenna element to the low noise amplifier 212.

The signal amplified by the low noise amplifier 212 is input to the receiver 216 with means of a termination input switch 218. The termination input switch 218 in combination together with adder unit 220 serve the purpose of diagnosis of the receiver 216. By enabling the termination input switch 218, the presence of an antenna element together with a coil element conditioner 202 are simulated and the receiver 216 can be tested independent of the real presence of the antenna element 200 and the coil element conditioner 202.

The RF signal transmitted through the termination input switch 218 is inputted into the adder unit 220 which adds an output of Digital-Analogue-Converter 240 to the RF signal, providing a feedback loop for test purposes of the receiver unit 216, as discussed below. At the output of the adder unit 220, the RF signal is input into amplifiers 222, an anti-aliasing filter 224 in the high gain path of one of the amplifiers and a Multi-Analogue-Digital-Converter 226. As known in the art, the anti-aliasing filter 224 is used to suppress out-of-band signals and noise. The Multi-Analogue-Digital-Converter 226 thereby serves the purpose of providing an enlarged dynamic range for the analogue-digital-conversion.

Afterwards, the digitized signal is fed into a resampling unit 228. Thereby, the resampling unit 228 resamples the variable ADC sample rate to a fixed rate of the digital down converter 230. The resampled digitized data are then input into the digital down converter 230 which reduces the data rate of the digitized signal.

Supplying the digital down converted signal to a data encoding unit 232 allows for data encoding and/or compression with knowledge of the actual data. The encoded digitized signal is further transmitted to an element based merge unit 250 which serves the purpose of merging MR data and status incoming from multiple coils and also multiple possibly connected receivers to the receiver 216. The element based merge unit 250 features multiple interfaces with the receiver 216: an interface to receiver remote stretch engines 246, an MR data offload interface 252a, an interface for providing the receiver with a recovered clock by means of the ADC Local clock generator 236, and an interface for access via control unit 242 to the control and status state for (De)-tuning of the connected antenna elements by means of the connected coil element conditioners 202. The elements based merge unit 250 further comprises a fiber interface to other receiver building blocks and a sub-coil detection interface.

The Analogue-Digital-Converter local clock generator 236 is controlled by the local clock, i.e., a voltage controlled oscillator and a phase locked loop (VCO and PLL) 248. Thereby, the Analogue-Digital-Converter local clock generator 236 is necessary for providing multiple frequencies to the Multi-Analogue-Digital-Converter 226 which is necessary to perform MRI at multiple magnetic fields for multiple nuclei providing a highly flexible receiver 216 without the need of changing the hardware of the receiver. Control of the ADC local clock generator 236 is performed by the remote stretch engines 246. The remote stretch engines 246 also control the samplings of the demodulation. In general, the stretch engine 246 dispatches commands over time in order to have a remote control status of components connected to the receiver 216.

The unit 238 serves the purpose to generate RF tune signals and to provide said signals to a Digital-Analogue-Converter 240 to input the resulting analogue signals to the adder unit 220. This is a feedback loop for test purposes of the receiver unit 216. The control unit 242 connected to the element based merge unit 250 serves to control the (De)-tune drive and state of the antenna element 200.

The non-volatile memory 244 of the element based merge unit 250 is important for example for identification of multiple coils connected to daisy chained multiple receivers. This is also important in case a plug-and-play functionality has to be implemented by enabling a dynamic network configuration that detects hot plugged digital interfaces connected to the element based merge unit 250 by means of the interface 252b. After interrogating the network node for its factory installed information (which coil, which elements connected to each receiver etc), the node is configured as part of the network. Centered in the configuration process is the fact that each RF receiver 216 has been given a unique number in the factory which is mapped by software in the configuration phase to a unique address. Such a unique ID is thereby essential for a wireless abstraction.

The receiver 216 further comprises a sub-coil detection unit 254 connected to the stretch engine 246. Such a sub-coil detection unit 254 is necessary in order to allow a flexible addition of multiple sub-coils 204 to one main coil which is then connected to the receiver 216. That is, the sub-coil detection unit 254 is used to detect if a unit is connected (daisy-chained) to the interface 252b.

Also comprised in the receiver 216 is a spike detection unit 234, which is also connected to the stretch engine 246.

It has to be mentioned, that the RF receiver 216, the coil element conditioner 202 and the antenna element 200 may be comprised in one common unitary unit, indicated by RF receiver coil unit 260. Thereby in order to effectively and continuously have a piece of digital electronics functional in the magnet bore it is absolutely necessary to shield the electronics of for example the RF receiver 216 due to possible spurious emissions from the powerful transmit pulses, which are even capable of destroying the electronics, let alone make them dizzy, since a strong transmit pulse is capable to induce high currents in even small wires. A very small signal will cause spurious noise and will therefore raise the MR noise floor significantly. Also it has to be ensured, that a magnetic field distortion due to the receiver electronics is extremely low. This requires the development of effectively shielded receiver units by using completely closed boxes comprising electronic components, as well as an optimization of the box design in order to prevent the formation of Eddy currents induced by switching of the gradient coils.

Figure 3:
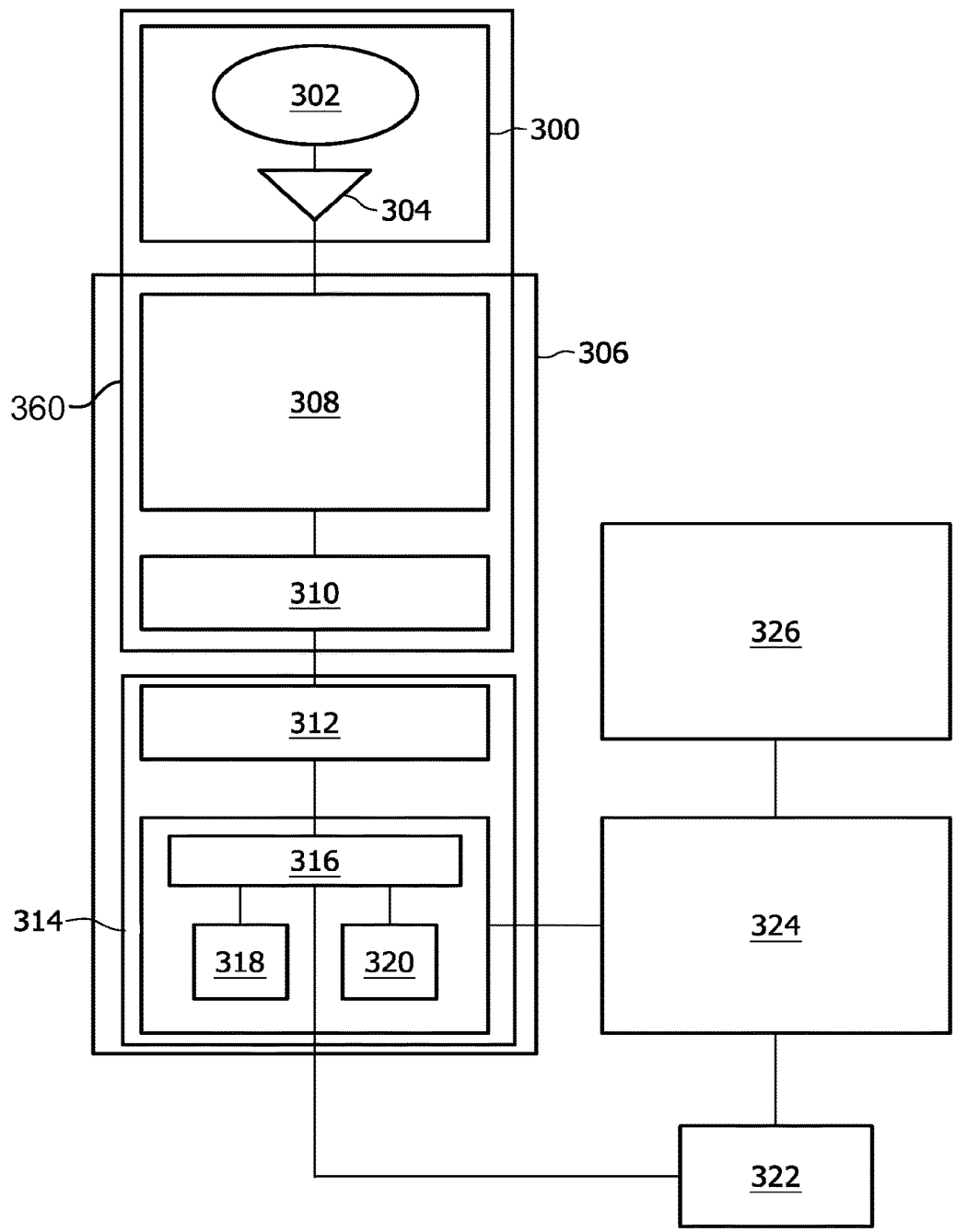
FIG. 3 is a block diagram depicting a coil assembly-master-RF interface structure according to the invention.

FIG. 3 shows a block diagram depicting a coil assembly-master-RF interface structure according to the invention. An RF receiver coil unit 360 includes a coil assembly 300 that mainly comprises an RF coil 302 and an amplifier 304 adapted for amplification of the MR signals received by the RF coil 302. The amplified signals are transmitted to an RF interface structure 306, discussed below.

The RF receiver coil unit 360 further comprises a receiver 308; and a network connector 310 which connects with a network connector 312 of an RF-chain slave sub-system 314 to form an interface for digital data transmission from the receiver 308 to the RF-chain slave subsystem 314. The RF-chain slave sub-system 314 also comprises a router 316, an RF scan control unit 318 and a system based merge unit 320. The receiver 308 and the network connector 312 of the RF receiver coil unit 360, together with the RF-chain slave sub-system 314, may collectively be referred to as an RF interface structure 306.

The router 316 serves the multiplexing of multiple network links connected to the RE-chain slave subsystem 314. For example, multiple receivers 308 may be connected to one RF-chain slave subsystem 314. The router 316 also serves the purpose of a physical layer translation. The RF scan control unit 318 controls for example the tune or detune state of the antenna 302, which is especially important for safety purposes. As already mentioned, in case the RF receive coil 302 is in the tune state during excitation of the investigated spin system using a high power RE pulse, the complete electronics of the receiver section 308 may be destroyed. Therefore, safety control is absolutely essential.

The RF-chain slave subsystem 314 is connected to a master control and data acquisition system 324. The master control and data acquisition 324 itself is connected to a data processing system 326 serving the purpose of reconstructing MR image data acquired by the coil assembly 300 and the receiver 308.

Also depicted in FIG. 3 is the system clock 322. In the present embodiment, the system clock 322 is connected to the master control and data acquisition system 324 and the RF interface structure 306. Thereby, the system clock is distributed via the digital links of the network. Synchronization of the master control and data acquisition system 324 and the RF interface structure 306 is achieved via a start signal. Remote digital receivers like the receiver 308 are synchronized by measuring phase deltas between receivers using an MR measurement and correcting for the measured delta in subsequent scans. The network takes care of routing the MR data packets from the remote digital receiver 308 to the reconstruction system 326. Furthermore, the network distributes the control and status commands from the master control and data acquisition system 324 to the digital receiver 308.

The master control and data acquisition system 324 also controls the (De-)tune driver of the coil assembly 300 and also monitors its proper function. An analogue-digital conversion is performed in the receiver 308 and all communications between the coil assembly 300 and the master control and data acquisition system 324 occur digitally via the network connectors 310 and 312 using optical fibers or a wireless solution. Since the remote digital receiver 308 also contains the demodulation data reduction and encoding, control and status functions are also run via the network to control these in addition to the required (De-) tune control and safety monitoring interlocks.

Figure 4:
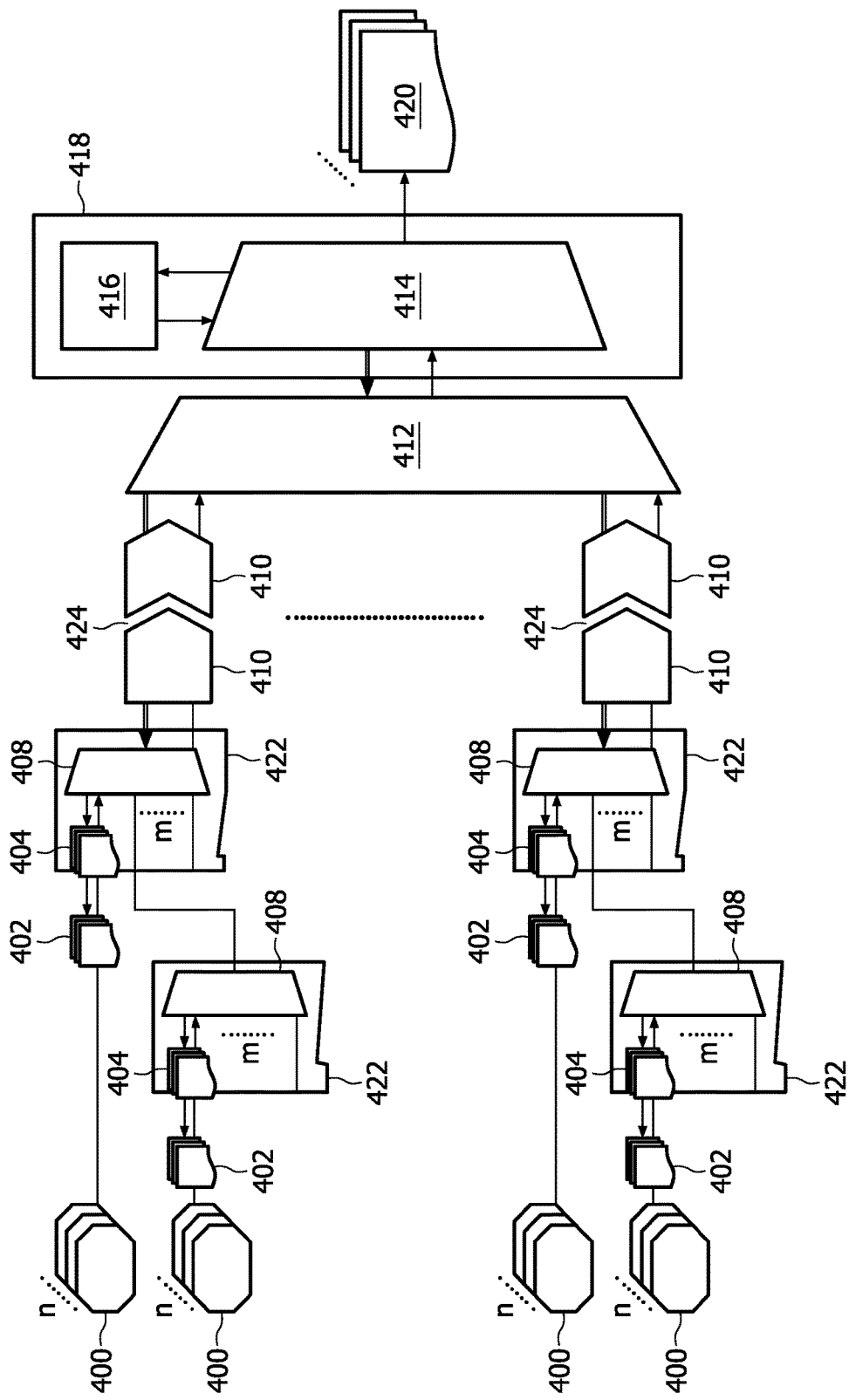
FIG. 4 is a block diagram depicting building blocks of a magnetic resonance imaging receive chain.

FIG. 4 shows a block diagram depicting building blocks of a magnetic resonance imaging receive chain. As already shown in FIG. 3, the building blocks of a magnetic resonance imaging receive chain comprise multiple antenna elements 400, coil element conditioner units 402 connected to each antenna element, digital receivers comprising means for analogue-digital converting of the received signals from the antennas 400 and an element based merge unit 408. The digital receiver 404 and the element based merge unit 408 are comprised in a receiver unit 422. Each receiver unit 422 has n receivers and m input fiber interfaces and a single fiber output. Using the element based merge unit 408, the receiver unit 422 merges all incoming MR data from each of the input fiber interfaces with the locally acquired data and forwards this to the next receiver unit 442 downstream or via the digital interface 410 to the system based merge unit 412 in the control and data acquisition system 418. Thereby, downstream is defined to be towards the master control and data acquisition system 418 from the receiver.

As can be seen in FIG. 4, due to the receiver unit 422 design, multiple receiver units 422 can be daisy chained and an arbitrary number of receivers can be connected to a single output fiber link.

The master control and data acquisition system comprises a controller 416 and the router 414. The system based merge unit 412 is also responsible for reading sensor information indicating whether or not a digital connector with means of an interface 410 has been connected to the master control and data acquisition system 418.

It has to be noted, that a network link 424 being adapted between the interfaces 410 in order to connect the receiver unit 422 to the master control and data acquisition system 418 can be adapted as a wireless, optical or wired communication link. However, in order to enable a wireless design of the building blocks of the magnetic resonance imaging receive chain of FIG. 4, two major communication principles in terms of merge and broadcast have to be used. In a wireless design a transmitter always broadcasts everything in principle to all receivers, with each receiver picking up that what interests it (addressing). Assuming collision handling is in place, all wireless solutions also merge data towards the wireless medium. A configuration phase that discovers all the receivers available is supported by providing the notation of a unique identifier of each addressed receiver.

Referring to FIG. 4, the controller 416 comprised in the master control and data acquisition system 418 serves the controlling of all real time aspects with the means of a separate processor board. With means of the router 414, the master control and data acquisition system 418 can also be connected to multiple data processing systems 420 adapted for reconstruction of acquired MR image data.

LIST OF REFERENCE NUMERALS

| | |
|---|---|
| 100 | Main magnet coils |
| 102 | Gradient coils |
| 104 | Patient |
| 106 | Coil |
| 108 | Main coil power supply |
| 110 | Power supply control |
| 112 | Receiver |
| 114 | Transmit coil amplifier |
| 116 | Gradient coils control |
| 118 | Analogue-Digital-Converter |
| 120 | Digital down converter |
| 122 | Encoder/Compressor |
| 124 | Element based merge unit |
| 126 | Spike detection unit |
| 128 | Local clock |
| 130 | Interface |
| 132 | Network |
| 134 | RF-chain slave subsystem |
| 136 | System clock |
| 138 | Interface |
| 140 | System based merge unit |
| 142 | RF scan control |
| 144 | Master control and data acquisition system |
| 146 | Data processing system |
| 148 | Screen |
| 150 | Input device |
| 152 | Memory |
| 154 | Interface |
| 156 | Processor |
| 158 | Computer program product |
| 160 | Module |
| 200 | Antenna element |
| 202 | Coil element conditioner |
| 204 | RF coil |
| 206 | Test coil |
| 208 | PIN diodes |
| 210 | Element matching unit |
| 212 | Amplifier |
| 214 | Decoupling unit |
| 216 | RF Receiver |
| 218 | Termination input switch |
| 220 | Adder Unit |
| 222 | Amplifier |
| 224 | Anti-aliasing filter |
| 226 | Multi-Analogue-Digital-Converter |
| 228 | Resampling unit |
| 230 | Digital down converter |
| 232 | Data encoding unit |
| 234 | Spike detection unit |
| 236 | ADC Local clock generator |
| 238 | Unit |
| 240 | Digital-Analogue-Converter |
| 242 | Control unit |
| 244 | Memory |
| 246 | Stretch engine |
| 248 | VCO and PLL |
| 250 | Elements based merge unit |
| 252 | Interface |
| 254 | Sub-coil detection unit |
| 300 | Coil assembly |
| 302 | RF coil |
| 304 | Amplifier |
| 306 | RF interface structure |
| 308 | Receiver |
| 310 | Connector |
| 312 | Connector |
| 314 | RF-chain slave subsystem |
| 316 | Router |
| 318 | RF scan control unit |

-continued

LIST OF REFERENCE NUMERALS

| | |
|---|---|
| 320 | System based merge unit |
| 322 | System clock |
| 324 | Master control and data acquisition system |
| 326 | Data processing system |
| 400 | Antenna element |
| 402 | Coil element conditioner unit |
| 404 | Digital receiver |
| 408 | Elements based merge unit |
| 410 | Interface |
| 412 | System based merge unit |
| 414 | Router |
| 416 | Controller |
| 418 | Master control and data acquisition system |
| 420 | Data processing system |
| 422 | Receiver unit |
| 424 | Network link |

The invention claimed is:

1. A nuclear magnetic resonance (NMR) imaging radio frequency receiver, which is integrated into a radio frequency receiver coil unit defining a unitary structure, the unitary structure further containing a radio frequency receive coil and a coil element conditioner as part of a magnetic resonance imaging apparatus, the radio frequency receiver itself comprising:
an analogue-digital converter configured for converting an analogue magnetic resonance signal, received from the radio frequency receive coil through the coil element conditioner, into a digital signal;
a digital down converter configured for down converting the digital signal in order to reduce a data rate of the digital signal;
a first communication interface configured for transmitting the down converted digital signal via a communication link, wherein a connection for passing the analogue magnetic resonance signal from the radio frequency receive coil to the analogue-digital converter is contained inside the radio frequency receiver coil unit; and
a local clock voltage controlled oscillator configured for providing a short term stable clock that drives the analogue-digital converter.

2. The NMR imaging radio frequency receiver of claim 1, wherein an analogue chain from the radio frequency receive coil to the analogue-digital converter has a length less than about 0.4 meter.

3. The NMR imaging radio frequency receiver of claim 1, wherein the local clock voltage controlled oscillator is synchronizable by a pilot tone signal, the pilot tone signal being generated by a pilot tone transmit coil of the magnetic resonance imaging apparatus.

4. The NMR imaging radio frequency receiver of claim 1, further comprising an encoder/compressor configured for at least one of encoding and compressing the down converted digital signal.

5. The NMR imaging radio frequency receiver of claim 1, further comprising:
an analogue-digital converter local clock generator controlled by the local clock voltage controlled oscillator, enabling the analogue-digital converter local clock generator being configured to provide multiple frequencies to the analogue-digital converter when performing MRI at multiple magnetic fields of multiple nuclei.

6. The NMR imaging radio frequency receiver of claim 1, further comprising a merge unit configured to combine the down converted digital signal with multiple digitized magnetic resonance signals and control and status signals for controlling the receiver, the multiple digitized magnetic resonance signals originating from multiple antenna elements of the receiver coil unit.

7. The NMR imaging radio frequency receiver of claim 1, further comprising an electronic testing circuit configured for examining electronic components of the radio frequency receiver using a test coil, said test coil being included in the radio frequency receiver coil unit.

8. The NMR imaging radio frequency receiver of claim 1, further comprising a spike detection unit configured detecting and removing spikes in the down converted digital signal.

9. The NMR imaging radio frequency receiver of claim 1, wherein the first communication interface is configured for providing the down converted digital signal via the communication link by wireless radio frequency transmission.

10. A radio frequency (RF) interface structure configured for a magnetic resonance imaging system, the RF interface structure comprising:
at least one NMR imaging radio frequency receiver according to claim 1;
at least one second communication interface configured for communication with the first communication interface of the radio frequency receiver;
a merge unit configured to combine multiple signals communicated over multiple second communication interfaces to or from multiple radio frequency receiver coil units; and
a radio frequency scan control unit configured for controlling the radio frequency receiver.

11. The NMR imaging radio frequency receiver of claim 1, wherein the voltage controlled oscillator comprises a voltage controlled crystal oscillator.

12. The NMR imaging radio frequency receiver of claim 1, wherein the local clock voltage controlled oscillator is synchronizable by a system clock.

13. The NMR imaging radio frequency receiver of claim 1, wherein the first communication interface is-configured for providing the down converted digital signal via the communication link by optical transmission.

14. The NMR imaging radio frequency receiver of claim 1, wherein the first communication interface is configured for providing the down converted digital signal via the communication link using a wired transmission.

15. A magnetic resonance imaging system, comprising:
a main magnet configured for generating a main magnetic field;
magnetic field gradient coils configured for selectively generating magnetic field gradients that are to be superimposed onto the main magnetic field;
a radio frequency receiver coil unit defining a unitary structure containing:
a radio frequency receive coil configured for receiving analogue radio frequency signals responsive to an applied radio frequency pulse sequence that has been applied to the magnetic field, a coil element conditioner connected to the radio frequency receive coil that processes the analogue radio frequency signals, and a radio frequency receiver coupled to the coil element conditioner that receives the processed analogue radio frequency signals, wherein the radio frequency receiver coil, the coil element conditioner and the radio frequency receiver are integrated into the unitary structure, and wherein the radio frequency receiver comprises:
an analogue-digital converter configured to convert an analogue magnetic resonance signal, received from the radio frequency receive coil via an analogue chain, into a digital signal;
a digital down converter configured to down convert the digital signal in order to reduce a data rate of the digital signal;
a local clock voltage controlled oscillator configured to provide a low jitter clock that drives the analogue-digital converter; and
a first communication interface configured to transmit the down converted digital signal via a communication link, wherein connection for passing the analogue magnetic resonance signal from the radio frequency receive coil to the analogue-digital converter is contained inside the radio frequency receiver coil unit;
a second communication interface configured for communication with the first communication interface via the communication link; and
a control and data acquisition system configured for communicating with the radio frequency receiver using the second communication interface.

16. The magnetic resonance imaging system of claim 10, further comprising:
a control and data acquisition system configured to generate at least one of pulse sequences and control commands in order to control an RF interface structure, including the radio frequency receiver.

17. The magnetic resonance imaging system of claim 15, wherein the analogue chain from the radio frequency receive coil to the analogue-digital converter has a length less than about 0.4 meter.

18. A method of processing a radio frequency signal received by a radio frequency receiver, which is integrated into a radio frequency receiver coil unit defining a unitary structure, the unitary structure further containing a radio frequency receive coil, a coil element conditioner and a local clock voltage controlled oscillator, as part of a magnetic resonance imaging apparatus, the method comprising:
receiving an analogue magnetic resonance signal from the receive coil, at the radio frequency receiver, via an analogue chain less than about 0.4 meter in length and contained within the radio frequency receiver coil unit;
converting the analogue signal into a digital signal using an analogue-digital converter driven by the local clock voltage controlled oscillator;
digital down converting the digital signal using a digital down converter; and
communicating the digital down converted signal from the radio frequency receiver coil unit over a first communication interface for enabling at least one of processing and displaying the digital down converted signals.

* * * * *